(12) United States Patent  
Hamilton et al.

(10) Patent No.: US 7,859,420 B2
(45) Date of Patent: Dec. 28, 2010

(54) DEVICES FOR TESTING THE OPERABILITY OF ELECTRONIC CIRCUITRY

(75) Inventors: Lance E. Hamilton, Lawrenceburg, KY (US); Andrew I. McGuire, Lexington, KY (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 404 days.

(21) Appl. No.: 12/135,662

(22) Filed: Jun. 9, 2008

(65) Prior Publication Data

US 2009/0303062 A1    Dec. 10, 2009

(51) Int. Cl.
*G08B 21/00* (2006.01)
*B60Q 1/00* (2006.01)
*G01R 31/02* (2006.01)
*H01H 31/02* (2006.01)
*G01M 17/00* (2006.01)
*G06F 7/00* (2006.01)
*G06F 19/00* (2006.01)
*H04B 3/46* (2006.01)
*H04B 17/00* (2006.01)
*H04Q 1/20* (2006.01)

(52) U.S. Cl. .................. 340/635; 340/459; 324/72.5; 324/556; 701/29; 375/228

(58) Field of Classification Search ............... 340/635, 340/459; 324/72.5, 556; 701/29; 375/228
See application file for complete search history.

(56) References Cited

U.S. PATENT DOCUMENTS

| | | | |
|---|---|---|---|
| 3,467,867 A | | 9/1969 | Armes et al. |
| 3,903,471 A | * | 9/1975 | Hiraga et al. ............... 324/133 |
| 4,092,591 A | * | 5/1978 | Lozowski ................... 324/110 |
| 4,110,571 A | | 8/1978 | Hills |
| 4,139,820 A | * | 2/1979 | Rode .......................... 324/133 |
| 4,694,408 A | * | 9/1987 | Zaleski ........................ 701/33 |
| 5,572,143 A | * | 11/1996 | Myers et al. ................ 324/555 |
| 5,635,843 A | | 6/1997 | Borland |
| 6,020,822 A | * | 2/2000 | Marshall ..................... 340/654 |
| 6,064,313 A | * | 5/2000 | Anderson ................... 340/660 |
| 6,219,039 B1 | * | 4/2001 | Chang et al. ................ 345/204 |
| 6,501,277 B1 | | 12/2002 | Sybesma |
| 6,731,217 B1 | * | 5/2004 | Warner ....................... 340/650 |
| 6,938,258 B1 | | 8/2005 | Weinberger et al. |
| 6,977,493 B2 | | 12/2005 | Novak |
| 7,061,371 B2 | * | 6/2006 | Shockley ................. 340/425.1 |
| 7,120,256 B2 | | 10/2006 | Grancea |
| 7,259,567 B2 | | 8/2007 | Sears et al. |
| 2009/0292416 A1 | * | 11/2009 | Ubik et al. .................... 701/33 |

* cited by examiner

*Primary Examiner*—Jennifer Mehmood
(74) *Attorney, Agent, or Firm*—Dinsmore & Shohl LLP (57) ABSTRACT

A device for testing the operability of an AC power outlet, a DC power outlet and A/V input jacks may include an AC test circuit, a DC test circuit, an A/V test circuit, a logic circuit, and a system OK indicator. At least the AC test circuit and the DC test circuit may be operatively connected to the logic circuit such that when at least the AC plug and the DC plug are inserted in a functioning power outlets, the system OK indicator is activated.

20 Claims, 9 Drawing Sheets

DEVICES FOR TESTING THE OPERABILITY OF ELECTRONIC CIRCUITRY

TECHNICAL FIELD

The present invention generally relates to devices for testing electronic circuitry and, more specifically, to devices for simultaneously testing the operability of AC power outlets, DC power outlets and A/V inputs located in a vehicle.

BACKGROUND

Vehicles commonly include auxiliary AC power outlet(s) and auxiliary DC power outlet(s) connected to the electric system of the vehicle. These outlets may be used to provide the appropriate AC or DC power to accessories such as a cell phone charger, emergency lighting, air compressors and the like. Vehicles may also be equipped with auxiliary audio/video (A/V) inputs operatively connected to the entertainment system (e.g., the audio system and video monitor) of the vehicle. Following installation in the vehicle, each of these outlets and/or inputs should be checked to verify proper operability. For example, a testing device may be inserted in the AC outlet of the vehicle to verify that the outlet outputs the proper AC signal thereby verifying that the wiring associated with the AC outlet has been properly connected to the electrical system of the vehicle. Similarly, a separate testing device may be inserted in the A/V inputs to verify the continuity of the input.

Currently, technicians carry multiple testing devices to test the operability of AC outlets, DC outlets and A/V inputs. The use of multiple devices may be cumbersome as the technician moves from vehicle to vehicle along the assembly line. Further, the technician must assess the operability of each circuit by visually examining the output of each testing device as each testing device is inserted into an outlet or input. Such repetitive operations may decrease assembly line efficiency.

Accordingly, a need exists for an alternative testing devices for efficiently testing the operability of an AC power outlet, a DC power outlet and A/V inputs.

SUMMARY

In one embodiment, a device for simultaneously testing the operability of an AC power outlet, a DC power outlet and A/V input jacks may include an AC test circuit, a DC test circuit, an A/V test circuit, a logic circuit, and a system OK indicator. The AC test circuit may include an AC plug operatively connected to an AC OK indicator such that, when the AC plug is inserted in a functioning AC power outlet, the AC OK indicator is illuminated. The DC test circuit may include a DC plug operatively connected to a DC OK indicator such that, when the DC plug is inserted in a functioning DC power outlet, the DC OK indicator is illuminated. The A/V test circuit may include a video plug such that, when the video plug is connected to a functioning video input jack the user of the testing device is provided with a visual indication of proper operation of the video input jack. At least the AC test circuit and the DC test circuit may be operatively connected to the logic circuit, wherein the logic circuit may be operable to trigger the system OK indicator when at least the AC plug and the DC plug are inserted in a functioning AC power outlet and a functioning DC power outlet, respectively.

In another embodiment, a device for simultaneously testing the operability of an AC power outlet, a DC power outlet and a video input jack, may include an AC test circuit, a DC test circuit, an A/V test circuit, a logic circuit, and a system OK indicator. The AC test circuit may include an AC plug operatively connected to a rectifying circuit and an AC OK indicator such that, when the AC plug is inserted in a functioning AC power outlet, an AC signal from the AC power outlet is converted to a DC signal and the AC OK indicator is illuminated. The DC test circuit may include a DC plug operatively connected to a voltage regulator and a DC OK indicator such that, when the DC plug is inserted in a functioning DC power outlet, the DC signal of the DC power outlet is regulated and the DC OK indicator is illuminated. The A/V test circuit may include a video plug operatively attached to an A/V OK indicator such that, when the video plug is connected to a video input jack operatively connected to a continuous video circuit, the A/V OK indicator is illuminated. The AC test circuit, the DC test circuit and the A/V OK test circuit may be operatively connected to the logic circuit, wherein the logic circuit may be operable to trigger the system OK indicator when the AC plug and the DC plug are inserted in a functioning AC power outlet and a functioning DC power outlet, respectively, and the video plug is connected to a video input jack operatively connected to a continuous video circuit.

In yet another embodiment, a device for simultaneously testing the operability of an AC power outlet, a DC power outlet, A/V input jacks, may include an AC test circuit, a DC test circuit, an A/V test circuit, a logic circuit, and a system OK indicator. The AC test circuit may include an AC plug operatively connected to a rectifying circuit and an AC OK indicator such that, when the AC plug is inserted in a functioning AC power outlet, an AC signal from the AC power outlet is converted to a DC signal and the AC OK indicator is illuminated. The DC test circuit may include a DC plug operatively connected to a voltage regulator and a DC OK indicator such that, when the DC plug is inserted in a functioning DC power outlet, the DC signal of the DC power outlet is regulated and the DC OK indicator is illuminated. The A/V test circuit may include a video plug operatively attached to a media source such that, when the video plug is connected to a video input jack which is operatively connected to a video monitor video media from the media source may be displayed on the video monitor thereby providing the user of the device with a visual indication of the operability of the video input jack. At least the AC test circuit and the DC test circuit may be operatively connected to the logic circuit, wherein the logic circuit may be operable to trigger the system OK indicator when a least the AC plug and the DC plug are inserted in a functioning AC power outlet and a functioning DC power outlet, respectively.

BRIEF DESCRIPTION OF THE DRAWINGS

The embodiments set forth in the drawings are illustrative and exemplary in nature and not intended to limit the inventions defined by the claims. The following detailed description of the illustrative embodiments can be understood when read in conjunction with the following drawings, where like structure is indicated with like reference numerals and in which:

DETAILED DESCRIPTION

Figure 1:
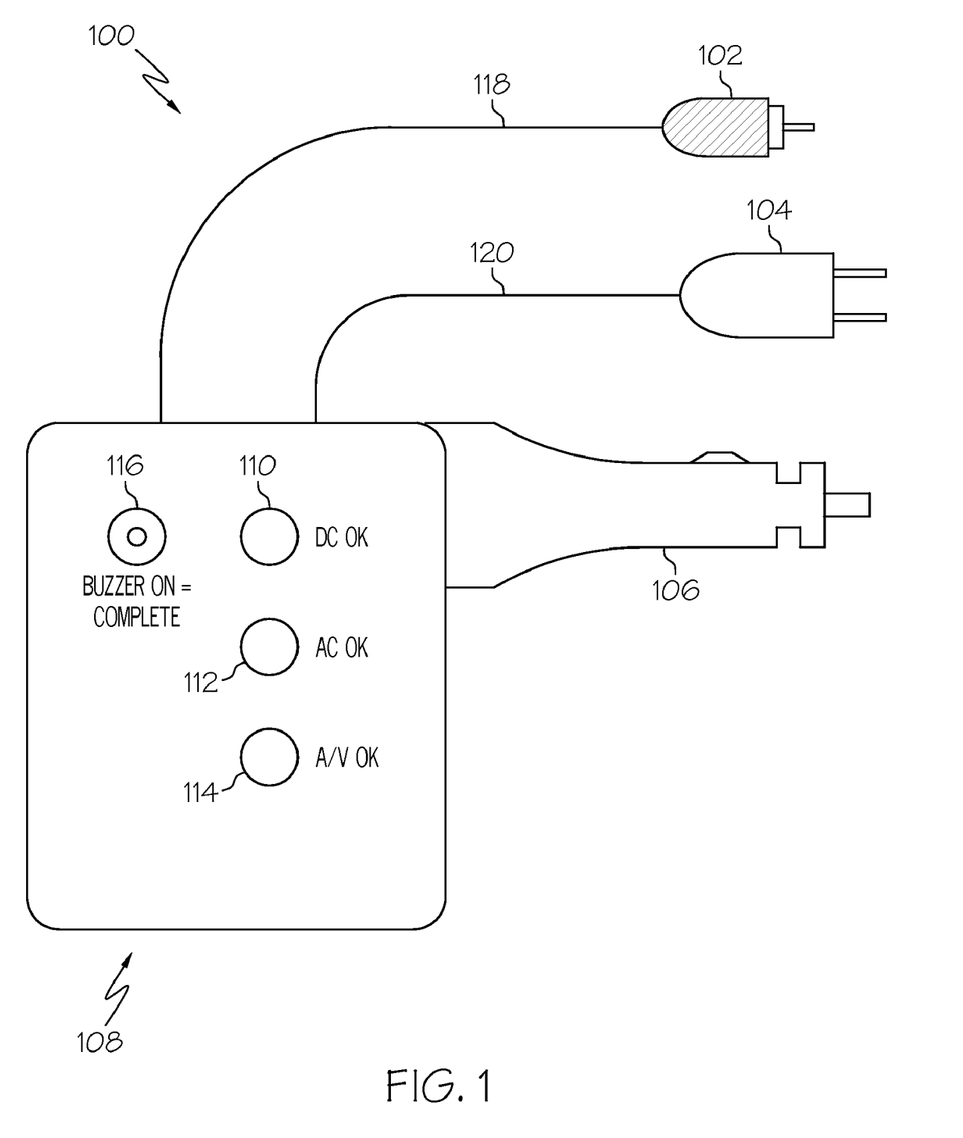
FIG. 1 depicts a schematic view of a testing device for simultaneously testing the operability of an AC outlet, a DC outlet and a video input according to one embodiment described herein.

FIG. 1 generally depicts one embodiment of a testing device for testing the operability of an AC power outlet, a DC power outlet and an input jack of an audio/video (A/V) device. The testing device generally comprises an A/V test circuit, an AC test circuit, a DC test circuit, a plurality of indicators for indicating the operability of each of an AC power outlet, a DC power outlet and a video input and a system OK indicator for indicating the operability of all of the AC power outlet, a DC power outlet and a A/V input jack. Various embodiments of the testing device and the operation of the testing device will be described in more detail herein.

Referring now to FIG. 1, one embodiment of a testing device 100 for testing the operability of an AC power outlet, a DC power outlet and an A/V input jack of an A/V device is shown. It should be understood that A/V input jack, as used herein, may refer to either an audio input jack, a video input jack or both. The testing device 100 generally comprises a housing 108 which contains the circuitry (shown in FIG. 3) of the testing device. The testing device 100 generally includes an AC plug 104, a DC plug 106 and a video plug 102 extending from the housing 108. The AC plug 104, the DC plug 106 and the video plug 102 are each electrically connected to the circuitry located inside the housing 108 and mechanically connected to the housing 108. In the embodiment shown in FIG. 1, the video plug 102 and AC plug 104 are connected to the housing 108 and circuitry by leads 118, 120 while the DC plug 106 is directly connected to the housing 108. However, it should be understood that each of the AC plug 102, the DC plug 106, and the video plug 104 may be either directly connected to the housing 108 or have a lead disposed between the plug and the housing 108 and circuitry.

In another embodiment (not shown) the AC plug 104, DC plug 106, and video plug 102 may be detachable from the housing 108 and interchangeable with similarly configured plugs having longer or shorter leads or, alternatively, no leads at all. To facilitate this embodiment, the housing 108 may include an AC terminal, a DC terminal, and a video terminal for receiving a detachable AC plug, DC plug, and video plug, respectively. Each of the terminals may be electrically connected to the circuitry of the testing device 100 such that, when the detachable plugs are installed in the respective terminals, the detachable plugs are electrically connected to the circuitry of the testing device.

Still referring to FIG. 1, a plurality of indicators may be mounted on or in the housing 108 of the testing device 100. More specifically, a DC OK indicator 110, an AC OK indicator 112 and a A/V OK indicator 114 may be mounted on or in the housing 108 and electrically connected to the circuitry of the testing device 100. The indicators 110, 112, 114 may comprise visual indicators and/or audible indicators that may be activated with an electrical signal. In the embodiment shown in FIG. 1, the DC OK indicator 110, the AC OK indicator 112 and the A/V OK indicator 114 may comprise a visual indicator such as an LED or similar visual indicator. However, it should be understood that the indicators may comprise any other suitable visual indicator which may be illuminated with an electrical signal and/or an audible indicator that may be activated with an electrical signal.

The AC OK indicator 112 and the DC OK indicator 110 may be electrically connected to the AC plug 104 and the DC plug 106, respectively, such that when the AC plug 104 and the DC plug 106 are inserted into a functioning AC outlet and a functioning DC outlet, respectively, the AC OK indicator 112 and the DC OK indicator 110 are illuminated. Similarly, the A/V OK indicator 114 may be electrically connected to the video plug 102 such that, when the video plug 102 is inserted into a video input jack operatively connected to a continuous video circuit, the A/V OK indicator 114 is illuminated.

Still referring to FIG. 1, a system OK indicator 116 may also be mounted on or in the housing 108 of the testing device 100. The system OK indicator 116 may comprise an audible and/or a visual indicator. In the embodiment shown in FIG. 1, the system OK indicator comprises an audible indicator such as a buzzer or beeper. The system OK indicator 116 is electrically connected to the DC OK indicator 110, the AC OK indicator 112, and the A/V OK indicator 114 via a logic circuit (discussed further herein) such that, when the DC OK indicator, the AC OK indicator and the A/V OK indicator are all illuminated (e.g., the AC plug 104 and DC plug 106 are connected to functioning AC and DC outlets, respectively, and the video plug 102 is connected to a continuous video circuit), the system OK indicator provides an audible and/or visual signal indicating the operability of the AC outlet, the DC outlet and the video circuit to which the testing device 100 is connected.

Figure 2:
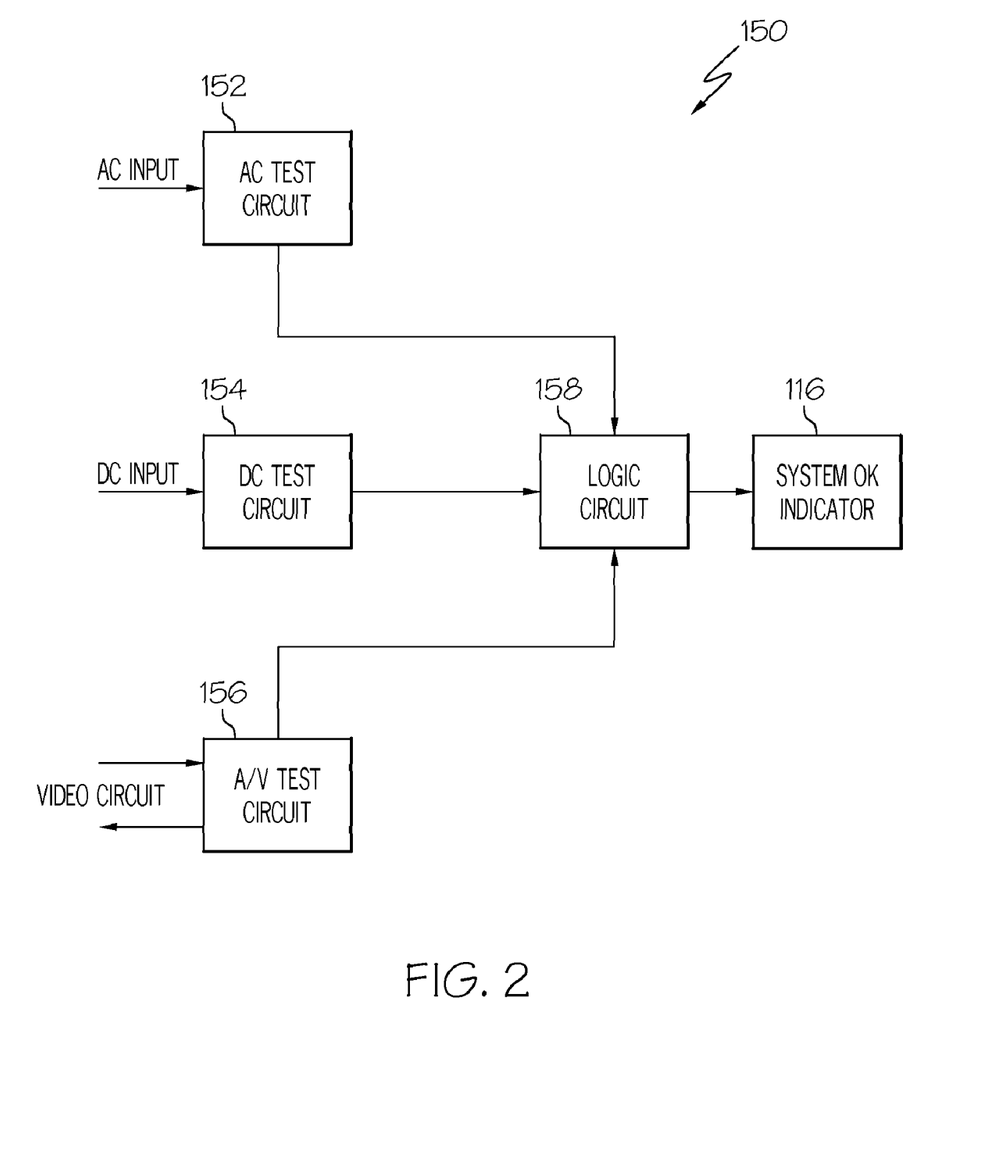
FIG. 2 is a block diagram of the circuitry of the testing device of FIG. 1.
Figure 3:
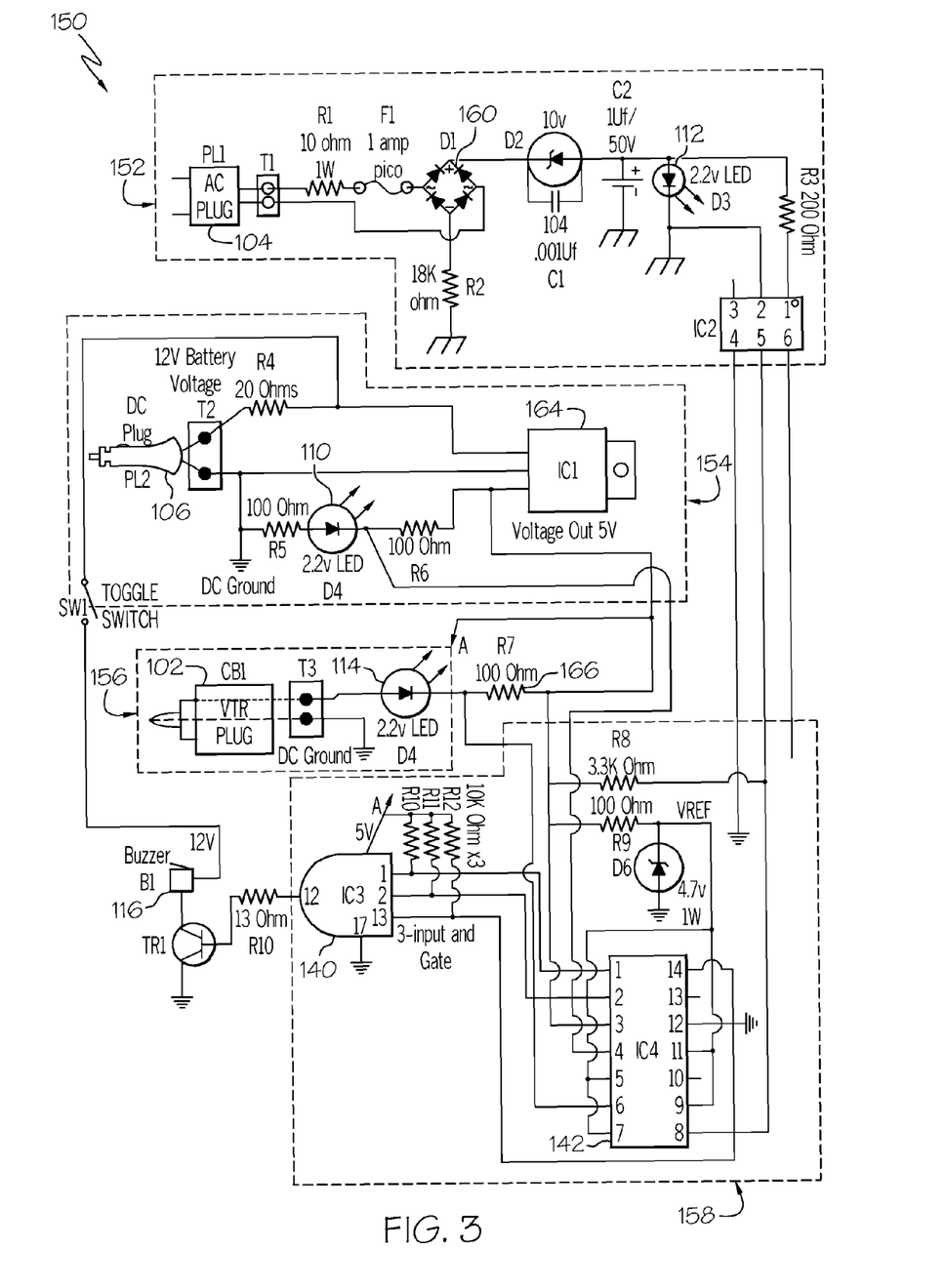
FIG. 3 depicts a circuit diagram for the testing device of FIG. 1 according to one embodiment described herein.

The circuitry of the testing device 100 shown in FIG. 1 will now be described in more detail with specific reference to FIGS. 2 and 3. Referring to FIGS. 2 and 3, the circuit 150 of the testing device 100 generally comprises an AC test circuit 152, a DC test circuit 154, an A/V test circuit 156 and a logic circuit 158 as shown in FIG. 2. The AC test circuit 152, the DC test circuit 154 and the A/V test circuit 156 are configured in parallel and the output of each test circuit is passed to the logic circuit 158. The output of the logic circuit 158 is, in turn, operatively coupled to the system OK indicator 116.

The AC test circuit 152 is electrically connected to the AC plug 104 such that, when the AC plug 104 is inserted into a functioning AC outlet, an AC signal is input into the AC test circuit 152. The AC test circuit 152 generally comprises a bridge rectifying circuit 160, the AC OK indicator 112 (e.g., an LED as shown FIG. 3) and an optocoupler 162. The AC test circuit 152 may also include various resistors, diodes, capacitors and fuses. The components of the AC test circuit 152 may be connected as shown in FIG. 3.

In operation, a 115 volt AC signal received into the AC test circuit 152 is rectified and converted to a 1.8 volt DC signal by the bridge rectifying circuit 160 and the surrounding components. The rectified AC signal is passed through the AC OK indicator 112 thereby illuminating the AC OK indicator 112. After passing through the AC OK indicator 112, the rectified AC signal enters the optocoupler 162 which isolates the rectified AC signal from the logic circuit 158. The optocoupler 162 outputs a DC signal representative of the rectified AC signal while preventing voltage spikes or other discontinuities of the rectified AC signal from being passed through to the logic circuit 158. The DC output of the optocoupler 162 is passed to an input of the logic circuit 158.

However, if a 115 volt AC signal is not received into the AC test circuit (e.g., the AC outlet in which the AC plug 104 is inserted is not operable or not functioning properly), the AC OK indicator 112 is not illuminated and the AC test circuit does not pass a DC output to the input of the logic circuit 158.

The DC test circuit 154 is electrically connected to the DC plug 106 such that, when the DC plug 106 is inserted into a functioning DC outlet, a DC signal is input into the DC test circuit 154. The DC test circuit generally comprises a DC voltage regulator 164 and the DC OK indicator 110. The DC test circuit 154 may also comprise a variety of resistors as shown in FIG. 3. The components of the DC test circuit 154 may be connected as shown in FIG. 3.

In operation, a 13.2 volt DC signal received into the DC test circuit 154 via the DC plug 106 is passed to the voltage regulator 164 which outputs a 5 volt regulated DC signal, the regulated DC signal is passed to the DC OK indicator 110 (LED in FIG. 3) which, in conjunction with two biasing resistors, illuminates the DC OK indicator. The regulated DC signal is, thereafter, passed to an input of the logic circuit 158. The regulated DC signal is also supplied to the logic circuit 158. However, if the DC test circuit 154 does not receive a 13.2 volt DC signal (e.g., the DC outlet in which the DC plug 106 is inserted is not operable or not functioning properly), the DC OK indicator is not illuminated and a regulated DC signal is not passed to an input of the logic circuit 158.

The A/V test circuit generally comprises the video plug 102, the A/V OK indicator 114 (e.g., an LED in FIG. 3) and a resistor 166 oriented in an open loop configuration as shown in FIG. 3. The A/V test circuit receives a 5 volt regulated DC signal from the voltage regulator 164 of the DC test circuit.

In operation, when the video plug 102 is connected to a video input jack of a continuous video circuit, specifically a continuous video circuit having a 100 ohm load, the open loop of the A/V test circuit 156 is closed. The 100 ohm load of the video circuit, in conjunction with the resistor 166, illuminates the A/V OK indicator 114 and passes the regulated DC signal to an input of the logic circuit 158. However, if the video plug 102 is not connected to a video input or if the video circuit is not continuous, the A/V test circuit 156 remains open and the A/V OK indicator is not illuminated and the regulated DC signal is not passed to the input of the logic circuit 158.

The logic circuit 158 generally comprises a quad operational amplifier 142 integrated circuit and a 3-input AND gate 140. The 3-input AND gate is electrically coupled to the outputs of the operational amplifier 142. The output of the 3-input AND gate is, in turn, electrically coupled to the system OK indicator 116 (e.g., buzzer in FIG. 3) as shown in FIG. 3.

In operation, the quad operational amplifier 142 receives DC signals from the AC test circuit 152, the DC test circuit 154 and the A/V test circuit 156 and compares these signals to predetermined voltages for each of the test circuits. If the input from a particular test circuit is greater than the corresponding predetermined voltage (e.g., the AC outlet, the DC outlet or video circuit to which the testing device is connected is functioning properly), the quad operational amplifier 142 outputs a 3 volt signal to the 3-input AND gate 140. When the 3-input AND gate 140 simultaneously receives a 3 volt signal for each test circuit, the 3-input AND gate outputs a DC signal thereby activating the attached system OK indicator and indicating that the AC outlet, DC outlet and video input to which the testing device 100 is connected are all working properly.

However, if any one of the AC outlet, the DC outlet or video input to which the testing device is connected is not functioning properly (e.g., the AC outlet is not outputting a 115 volt AC signal, the DC outlet is not outputting a 13.8 volt DC signal or the video input is not connected to a continuous video circuit), or if the testing device is not connected to one or more of these outlets or inputs, the quad operational amplifier will not output a 3 volt DC signal to the 3-input AND gate for the malfunctioning outlet or input and the system OK indicator will not be activated.

While the circuit diagram shown in FIG. 3 generally depicts one exemplary embodiment of a circuit 150 that may facilitate the operation of the testing device as described herein, it should be understood that the circuit may have a variety of other constructions and may consist of various other components oriented and arranged in a circuit having the same functionality as will be apparent to one skilled in the art. Accordingly, unless otherwise stated herein, no particular limitation is intended as to the particular components and/or construction of the circuit used to achieve the functionality of the testing device.

Figure 4:
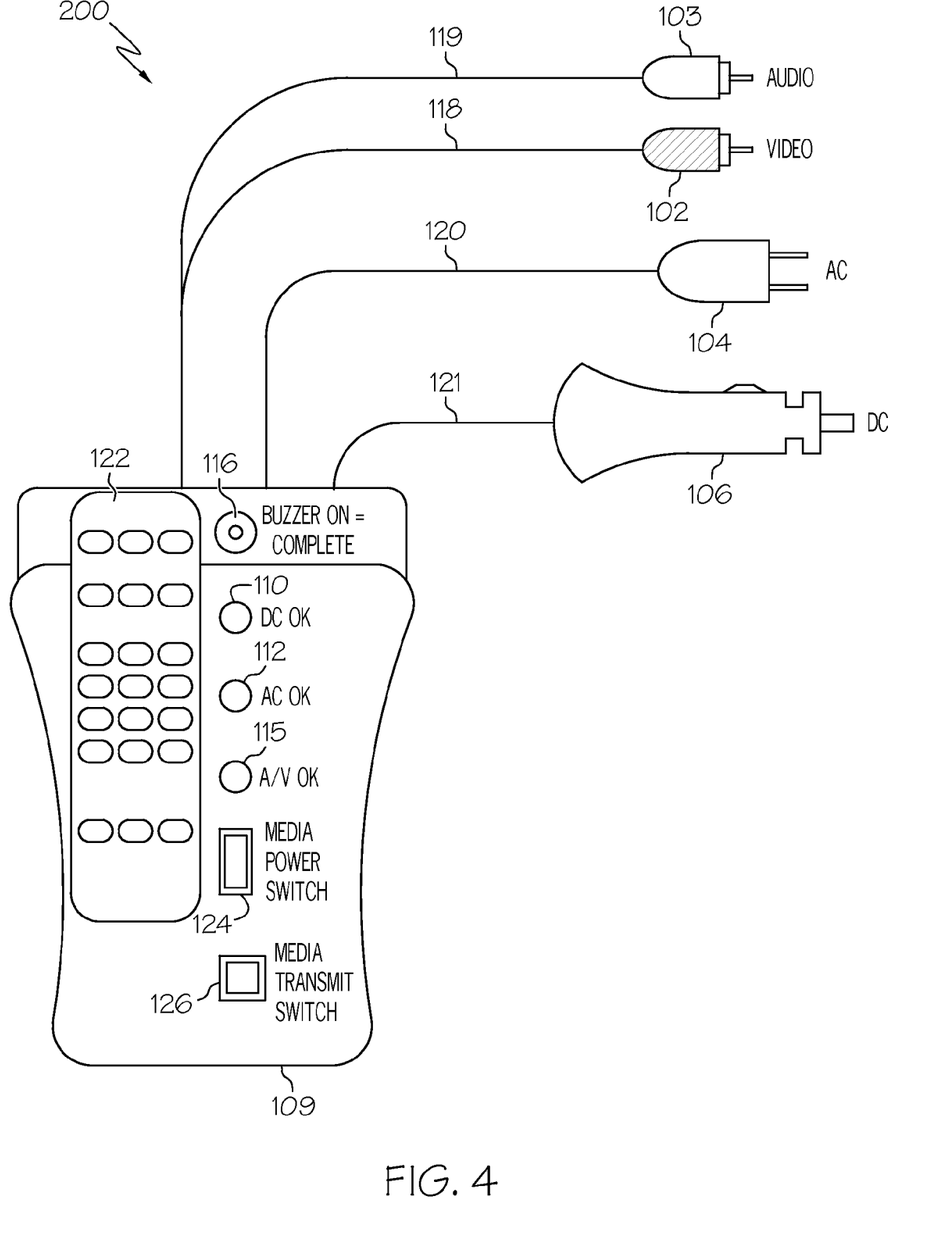
FIG. 4 depicts a schematic view of a testing device for simultaneously testing the operability of an AC outlet, a DC outlet, a video input and an audio input according to another embodiment described herein.

Referring now to FIG. 4, another embodiment of a testing device 200 for testing the operability of an AC power outlet, a DC power outlet and a video input jack and/or audio input jack of an A/V device is shown. As described hereinabove with respect to the testing device 100 shown in FIG. 1, the testing device 200 may generally include a housing 109 which encloses the circuitry of the testing device 200. The testing device 200 may also include an AC plug 104, a DC plug 106 and a video plug 102 extending from the housing 109. The AC plug 104, the DC plug 106 and the video plug 102 are each electrically connected to the circuitry located inside the housing 108 while also being mechanically connected to the housing 109. In the embodiment shown in FIG. 4, the testing device may also comprise an audio plug 103 electrically connected to the circuitry of the testing device 200. It should be understood that the testing device 200 may further comprise an additional audio plug (not shown) thereby facilitating the testing of left and right audio input jacks. The AC plug 104, the DC plug 106, the video plug 102 and the audio plug 103 may be attached to the housing 109 and circuitry of the testing device 200 with leads 120, 121, 118, 119, respectively.

The testing device 200 may also include a DC OK indicator 110, an AC OK indicator 112, an A/V OK indicator and a system OK indicator 116 each of which is mounted in or on the housing 109 as discussed hereinabove. The DC OK indicator 110, the AC OK indicator 112 and system OK indicator 116 may be operatively connected to the circuitry of the testing device as discussed hereinabove. A media power switch 124 and media transmit switch 126 may also be mounted in or on the housing 109. Each of the A/V OK indicator 114, the media power switch 124 and media transmit switch 126 may be operatively connected to the circuitry of the testing device 200 as will be described further herein.

In one embodiment, as shown in FIG. 4, the testing device 200 may also include a remote control module 122. The remote control module 122 may be a standard remote control module compatible with A/V equipment to which the testing device 200 may be connected and/or used in conjunction with. The remote control module 122 may be either mounted on or contained within the housing 109 of the testing device 200. In one embodiment, the remote control module 122 is a separate module mechanically fixed to the housing 109 of the testing device 200. In another embodiment (not shown), the remote control module 122 is electrically connected to the circuitry of the testing device 200.

Figure 5:
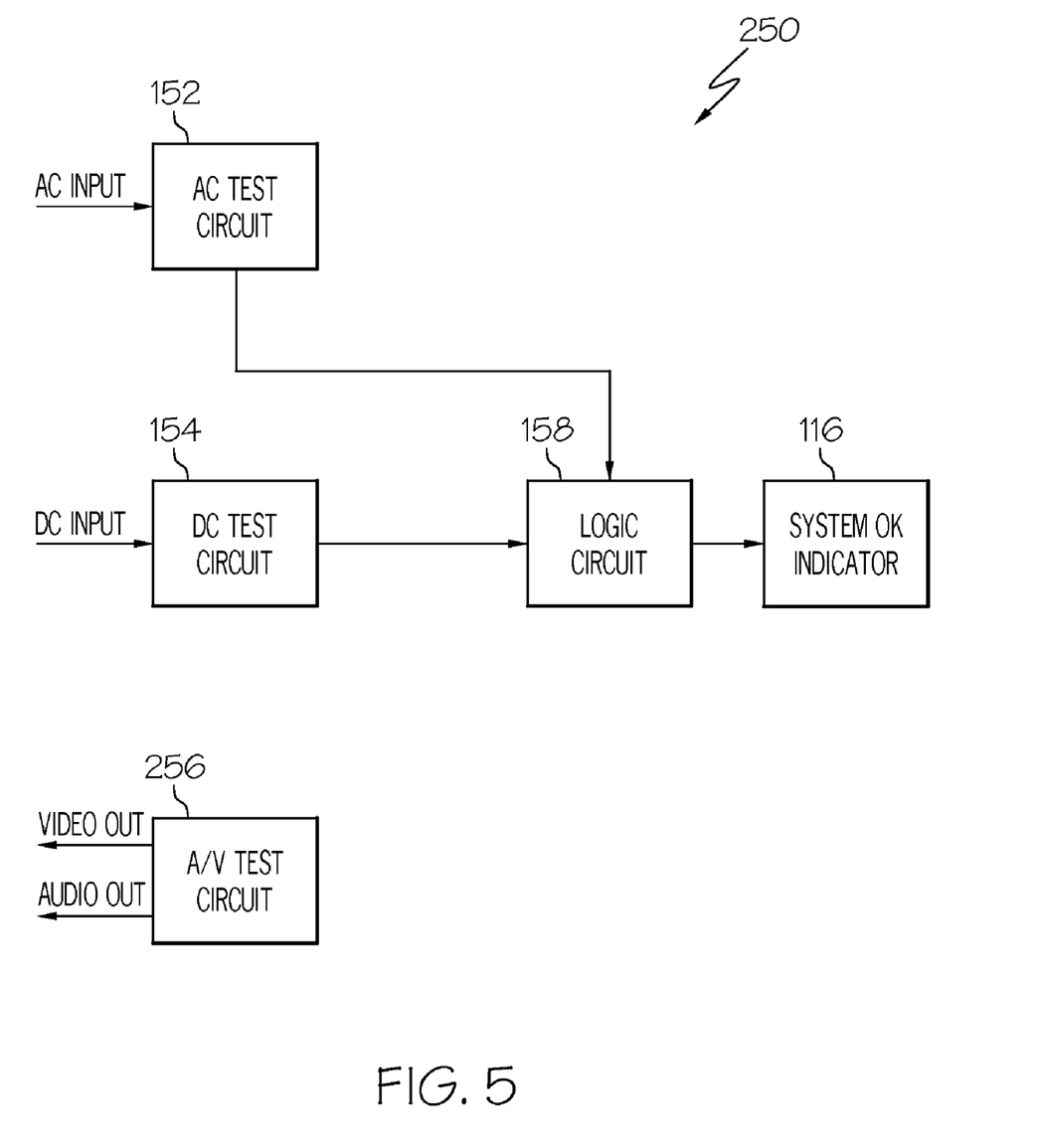
FIG. 5 depicts a block diagram of the circuitry of the testing device of FIG. 4.
Figure 6:
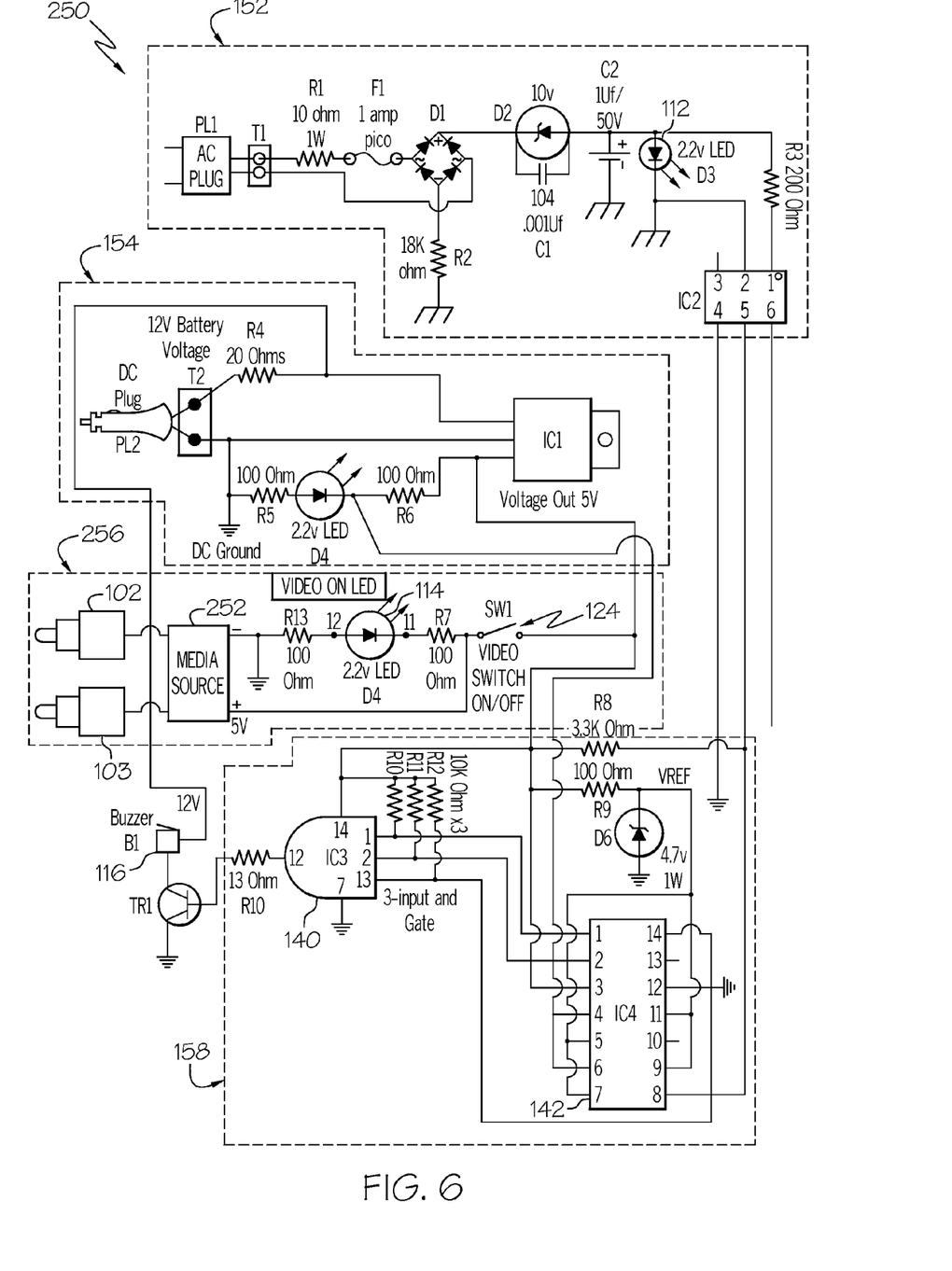
FIG. 6 depicts a circuit diagram for the testing device of FIG. 4 according to one embodiment described herein.

The circuitry of the testing device 200 shown in FIG. 4 will now be described in more detail with specific reference to FIGS. 5 and 6. Referring to FIGS. 5 and 6, the circuit 250 of the testing device 200 generally comprises an AC test circuit 152, a DC test circuit 154, an A/V test circuit 256 and a logic circuit 158 as shown in FIG. 5. The AC test circuit 152 and the DC test circuit 154 are configured in parallel and the output of each test circuit is passed to the logic circuit 158. The output of the logic circuit 158 is, in turn, operatively coupled to the system OK indicator 116. In this embodiment, the A/V circuit operates as a stand-alone circuit.

The AC test circuit 152 and DC test circuit 154 depicted in FIG. 6 may have the same construction and operation as the AC test circuit 152 and DC test circuit 154 depicted in FIG. 3 and described hereinabove. However, in the embodiment shown in the circuit shown in FIG. 6, the output of the DC test circuit 154 is passed to both the A/V and DC test circuit inputs of the logic circuit 158 while the A/V test circuit 256 is not connected to the logic circuit 158. More specifically, to compensate for the absence of an A/V test circuit signal into the logic circuit 158, the output of the DC test circuit 154 is passed to two different inputs on the quad operational amplifier 142 such that two of the 3 outputs of the quad operational amplifier 142 are indicative of the status of the DC test circuit. In this manner, the quad operational amplifier 142 may still output 3 signals to the 3-input AND gate 140 and thereby trigger the system OK indicator 116. Alternatively, the circuit 250 may comprise a 2-input AND gate in place of the 3-input AND gate thereby eliminating the need to compensate for the absence of the A/V test circuit signal into the logic circuit 158.

Further, The A/V test circuit 256 in the circuit 250 shown in FIG. 6 may generally include an A/V media source 252, the A/V OK indicator 114 (LED in FIG. 6) and a media power switch 124. In the embodiment shown in FIG. 6, the media source 252 may comprise a printed circuit board comprising memory having video and/or audio media stored on the media. The A/V media source 252, may be operatively connected to the media transmit switch 126 located on or in the housing 109. The video plug 102 and audio plug 103 may be electrically connected to the media source 252 such that video and/or audio media contained on the media source 252 may be transmitted through the video plug 102 and the audio plug 103.

In operation, a 5 volt regulated DC signal is supplied to the A/V media source 252 from the voltage regulator when the media power switch 124 is closed thereby illuminating the A/V OK indicator 114 and energizing the A/V media source 252. When the media transmit switch 126 is depressed, A/V media stored on the A/V media source 252 may be transmitted via the video plug 102 and/or audio plug 103. When the video plug 102 and/or audio plug 103 are connected to a compatible A/V device, the transmitted A/V media may be displayed and/or played on the A/V device thereby demonstrating the operability of the connected A/V device and associated circuitry.

Figure 7:
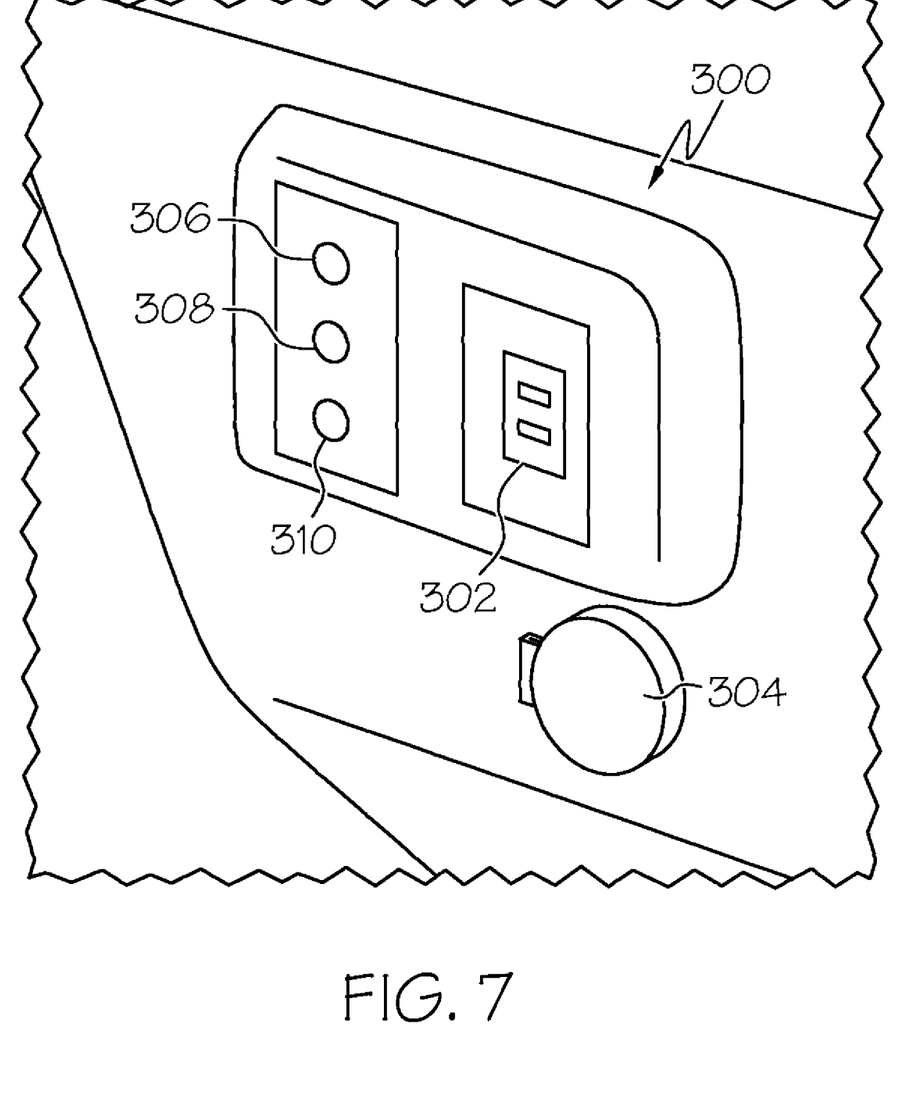
FIG. 7 depicts an AC power outlet, a DC power outlet and A/V inputs as may be commonly found in a vehicle.

While the circuit diagram shown in FIG. 7 generally depicts one exemplary embodiment of a circuit 250 that may facilitate the operation of the testing device as described herein, it should be understood that the circuit may have a variety of other constructions and may consist of various other components oriented and arranged in a circuit having the same functionality as will be apparent to one skilled in the art. Accordingly, unless otherwise stated herein, no particular limitation is intended as to the particular components and/or construction of the circuit used to achieve the functionality of the testing device.

Further, while the testing device 100 shown in FIG. 1 generally comprises an A/V test circuit which tests the continuity of a video input and the associated circuitry and the testing device 200 shown in FIG. 4 generally comprises an A/V test circuit which outputs video and/or audio from a media source to test the operability of attached video circuits, audio circuits and associated A/V components, it should now be understood that both functionalities may be included in a single testing device by including the A/V testing circuit 156 of the testing device 100 and the A/V testing circuit 256 of the testing device 200 in a single testing device.

Figure 8:
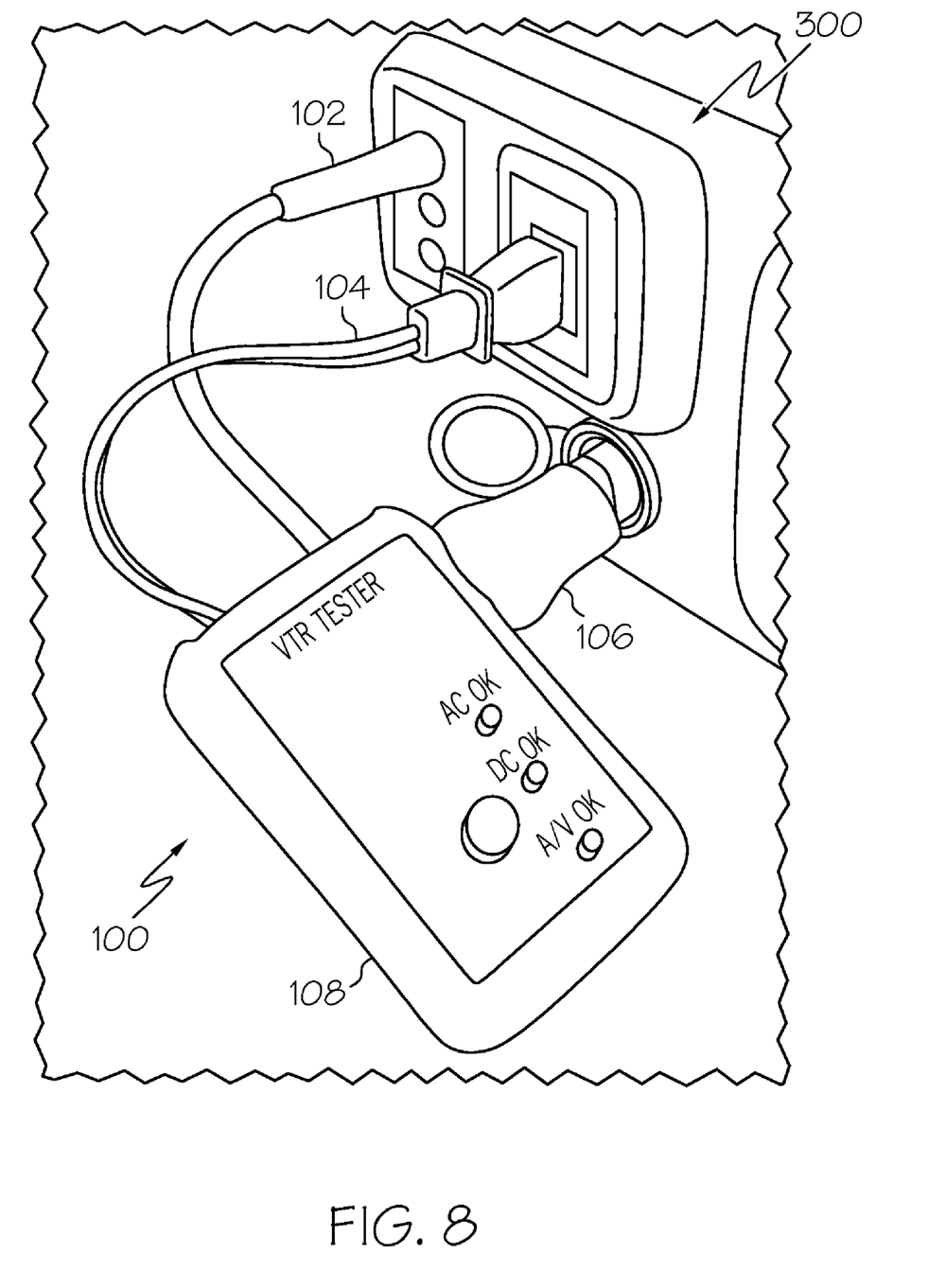
FIG. 8 depicts the testing apparatus of FIG. 1 connected to the AC power outlet, DC power outlet and video input shown in FIG. 5.
Figure 9:
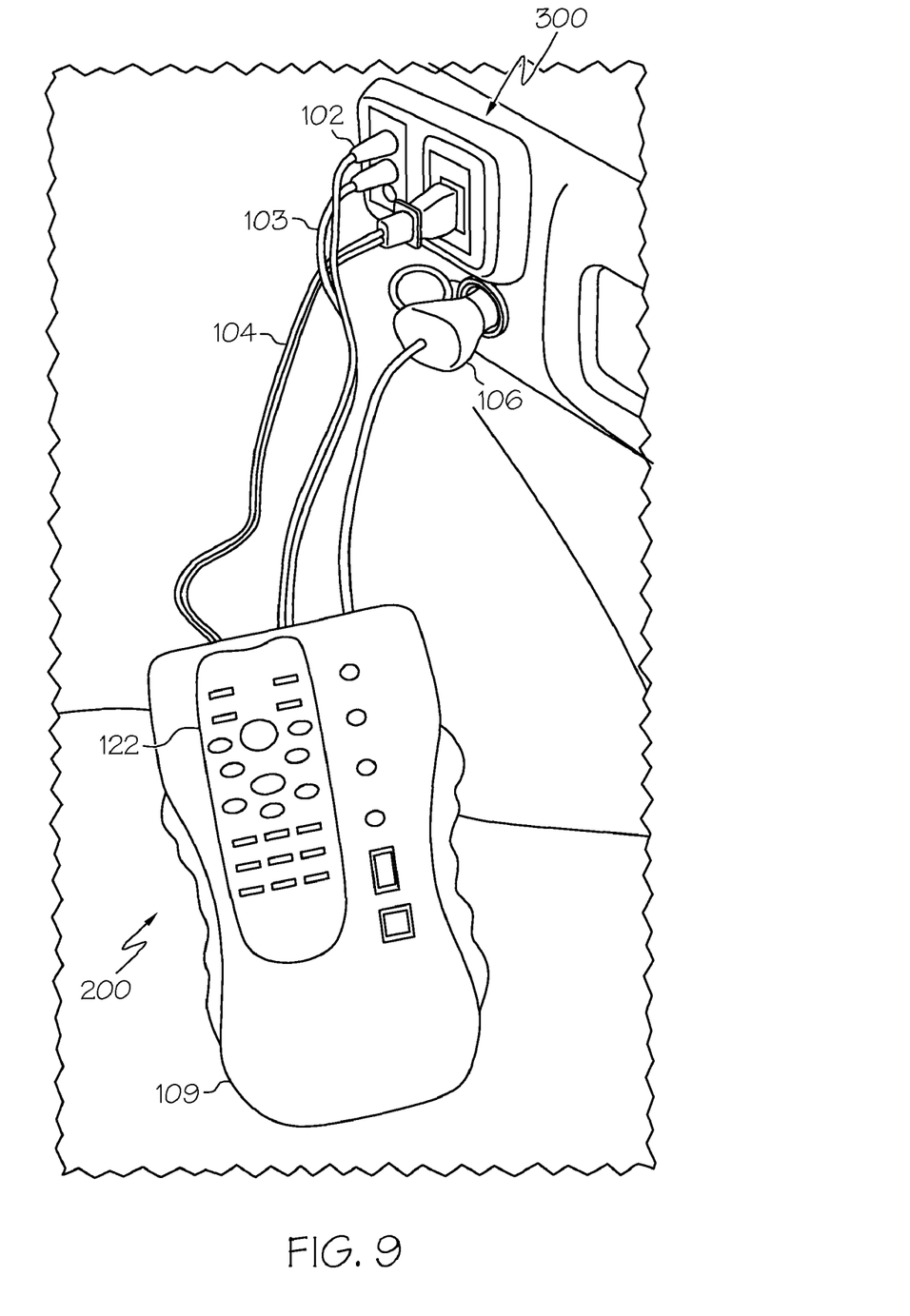
FIG. 9 depicts the testing apparatus of FIG. 4 connected to the AC power outlet, DC power outlet and A/V inputs shown in FIG. 7.

Referring now to FIG. 7-9, the testing devices 100, 200 described herein are well suited for testing the operability of an AC power outlet, a DC power outlet and video and/or audio inputs and associated circuits such as the auxiliary power outlets and A/V inputs commonly found in vehicles. For example, as shown in FIG. 7, a vehicle may include a panel 300 on which an auxiliary AC power outlet 302, an auxiliary DC power outlet 304, a video input jack 306 and audio input jacks 308, 310 are positioned. The video input jack 306 and audio input jacks 308, 310 may be operatively connected to A/V components (not shown) positioned in the vehicle such as a video monitor, an audio system and the like.

In one embodiment, as shown in FIG. 8, the testing device 100 may be used to test the operability of the AC power outlet 302, the DC power outlet 304 and the video input jack 306 and associated circuitry by inserting the DC plug 106 into the DC power outlet 304, the AC plug 104 into the AC power outlet 302 and the video plug 102 into the video input jack 306. If the AC power outlet is functioning properly (e.g., the AC outlet is outputting a 115 volt AC signal) the AC OK indicator on the testing device 100 will illuminate. If the DC power outlet is functioning properly (e.g., the DC outlet is outputting a 13.2 volt DC signal), the DC OK indicator on the testing device 100 will illuminate. If the video input jack is connect to a continuous video circuit having the proper impedance, the A/V OK indicator will illuminate. When all three indicators are illuminated, the system OK indicator will activate thereby alerting the user of the testing device 100 that each of the power outlets and the video input are installed and operating properly.

In another embodiment, as shown in FIG. 9, the testing device 200 may be used to test the operability of the AC power outlet 302, the DC power outlet 304, the video input jack 306 and associated circuitry, and the audio input jack 308 and associated circuitry by inserting the DC plug 106 into the DC power outlet 304, the AC plug 104 into the AC power outlet 302, the video plug 102 into the video input jack 306, and the audio plug 103 into the audio input jack 308. If the AC power outlet is functioning properly (e.g., the AC outlet is outputting a 115 volt AC signal) the power AC OK indicator on the testing device 100 will illuminate. If the DC power outlet is functioning properly (e.g., the DC outlet is outputting a 13.2 volt DC signal), the DC OK indicator on the testing device 100 will illuminate. When the AC OK indicator and the DC OK indicator are illuminated on the testing device 200, the system OK indicator will activate thereby alerting the user of the testing device 200 that each of the power outlets are installed and operating properly. Turning to the video input jack 306 and the audio input jack 308, the media source 252 is powered on using the media power switch on the testing device 200. The A/V OK indicator will thereafter illuminate indicating that the media source is energized. A/V media stored in the media source 252 may be transmitted to the attached A/V components by depressing the media transmit switch on the testing device 200. This transmits the stored video and/or audio media to the attached A/V components via the video plug 102 and audio plug 103 thereby displaying and/or playing the stored media on the attached A/V components and demonstrating the operability of the video input jack 306 and associated circuitry, the audio input jack 308 and associated circuitry and the attached A/V components.

Further, the testing device 200 may also be used to test the operability of the remote control functions of the A/V components operatively attached to the video input jack 306 and the audio input jacks 308, 310. More specifically, after the video plug 102 and audio plug 103 are inserted into the corresponding input jacks 306, 308 in the panel 300, the remote control module 122 mounted on the testing device 200 may be used to power on the A/V components thereby verifying that the A/V components are properly installed and that the remote control functions of the A/V components are working properly.

It should now be understood that the testing device described herein may be used to verify the operability of an AC power outlet, a DC power outlet and A/V inputs and related components and circuitry installed in a vehicle. Combining the AC test circuit, the DC test circuit, and the A/V test circuit in a single device reduces the overall number of pieces of equipment necessary to perform the testing operations. Furthermore, the use of a logic circuit to provide one global indication that all the outlets and/or inputs being tested are functioning properly improves the efficiency of the testing operation and, when one or more of the outlets or inputs being tested is not functioning properly and/or is inoperable, the use of individual indicators associated with each outlet or input being tested (e.g., the AC OK indicator, the DC OK indicator and the AV OK indicator) facilitates a quick determination of which outlet and/or input being tested is inoperable and/or not functioning properly.

While specific reference is made herein to using the testing device to simultaneously test AC and DC power outlets and audio and video inputs located in a vehicle, it should be understood that the testing device described herein may also be used to simultaneously test any AC power outlet, DC power outlet and audio and video inputs located in proximity to one another.

While particular embodiments and aspects of the present invention have been illustrated and described herein, various other changes and modifications can be made without departing from the spirit and scope of the invention. Moreover, although various inventive aspects have been described herein, such aspects need not be utilized in combination. It is therefore intended that the appended claims cover all such changes and modifications that are within the scope of this invention.

What is claimed is:

1. A device for simultaneously testing the operability of an AC power outlet, a DC power outlet an A/V input jack, the device comprising an AC test circuit, a DC test circuit, an A/V test circuit, a logic circuit, and a system OK indicator, wherein:

the AC test circuit comprises an AC plug operatively connected to an AC OK indicator such that, when the AC plug is inserted in a functioning AC power outlet, the AC OK indicator is activated;

the DC test circuit comprises a DC plug operatively connected to a DC OK indicator such that, when the DC plug is inserted in a functioning DC power outlet, the DC OK indicator is activated;

the A/V test circuit comprises a video plug such that, when the video plug is connected to a functioning video input jack the user of the testing device is provided with an indication of proper operation of the video input jack wherein the indication may be visual, audible or both; and at least the AC test circuit and the DC test circuit are operatively connected to the logic circuit, wherein the logic circuit is operable to trigger the system OK indicator when at least the AC plug and the DC plug are inserted in a functioning AC power outlet and a functioning DC power outlet, respectively.

2. The device of claim 1 wherein the A/V test circuit further comprises an A/V OK indicator operatively connected to the video plug such that, when the video plug is inserted into a video input jack operatively connected to a continuous video circuit, the A/V OK indicator is activated; and the A/V test circuit is operatively connected to the logic circuit and the logic circuit is operable to trigger the system OK indicator when the video plug is operatively connected to a continuous video circuit and the AC plug and the DC plug are inserted in a functioning AC power outlet and a functioning DC power outlet, respectively.

3. The device of claim 1 wherein the A/V test circuit further comprises a media source operatively connected to the video plug such that, when the video plug is connected to a video input jack which is operatively connected to a video monitor, video media from the media source may be displayed on the video monitor thereby providing the user of the device with a visual indication of the operability of the video input jack.

4. The device of claim 3 wherein the A/V test circuit further comprises an audio plug operatively connected to the media source such that, when the audio plug is connected to an audio input jack which is operatively connected to an audio system, audio from the media source may be played over the audio system thereby providing the user of the device with audible verification of the operability of the audio input jack.

5. The device of claim 1 further comprising a remote control module.

6. The device of claim 1 wherein the AC plug, the DC plug and the video plug are detachable.

7. The device of claim 1 wherein the AC plug, the DC plug and the video plug are attached to the device with leads.

8. The device of claim 1 wherein the AC outlet, the DC outlet and the video input jack are located in a vehicle.

9. The device of claim 1 wherein the system OK indicator comprises an audible indicator, a visual indicator or both.

10. A device for simultaneously testing the operability of an AC power outlet, a DC power outlet and a video input jack, the device comprising an AC test circuit, a DC test circuit, an A/V test circuit, a logic circuit, and a system OK indicator, wherein:

the AC test circuit comprises an AC plug operatively connected to a rectifying circuit and an AC OK indicator such that, when the AC plug is inserted in a functioning AC power outlet, an AC signal from the AC power outlet is converted to a DC signal and the AC OK indicator is illuminated;

the DC test circuit comprises a DC plug operatively connected to a voltage regulator and a DC OK indicator such that, when the DC plug is inserted in a functioning DC power outlet, the DC signal of the DC power outlet is regulated and the DC OK indicator is illuminated;

the A/V test circuit comprises a video plug operatively attached to an A/V OK indicator such that, when the video plug is connected to a video input jack operatively connected to a continuous video circuit, the A/V OK indicator is illuminated; and the AC test circuit, the DC test circuit and the A/V test circuit are operatively connected to the logic circuit, wherein the logic circuit is operable to trigger the system OK indicator when the AC plug and the DC plug are inserted in a functioning AC power outlet and a functioning DC power outlet, respectively, and the video plug is connected to a video input jack operatively connected to a continuous video circuit.

11. The device of claim 10 wherein the rectifying circuit comprises a bridge rectifying circuit and the AC output signal of the AC power outlet is a 115 volt AC signal which is rectified to a 1.8 volt DC by the rectifying circuit before the AC OK indicator is illuminated.

12. The device of claim 10 wherein the DC output signal of the DC power outlet is a 13.2 volt DC signal which is regulated to a 5 volt DC signal by the DC regulator before the DC OK indicator is illuminated.

13. The device of claim 10 wherein the logic circuit comprises a quad operational amplifier and a 3 input AND gate.

14. A device for simultaneously testing the operability of an AC power outlet, a DC power outlet, A/V input jacks, the device comprising an AC test circuit, a DC test circuit, an A/V test circuit, a logic circuit, and a system OK indicator, wherein:

the AC test circuit comprises an AC plug operatively connected to a rectifying circuit and an AC OK indicator such that, when the AC plug is inserted in a functioning AC power outlet, an AC signal from the AC power outlet is converted to a DC signal and the AC OK indicator is illuminated;

the DC test circuit comprises a DC plug operatively connected to a voltage regulator and a DC OK indicator such that, when the DC plug is inserted in a functioning DC power outlet, the DC signal of the DC power outlet is regulated and the DC OK indicator is illuminated;

the A/V test circuit comprises a video plug operatively attached to a media source such that, when the video plug is connected to a video input jack which is operatively connected to a video monitor video media from the media source may be displayed on the video monitor thereby providing the user of the device with a visual indication of the operability of the video input jack; and at least the AC test circuit and the DC test circuit are operatively connected to the logic circuit, wherein the logic circuit is operable to trigger the system OK indicator when a least the AC plug and the DC plug are inserted in a functioning AC power outlet and a functioning DC power outlet, respectively.

15. The device of claim 14 wherein the A/V test circuit further comprises an audio plug operatively connected to the media source such that, when the audio plug is connected to an audio input jack which is operatively connected to an audio system, audio media from the media source may be played over the audio system thereby providing the user of the device with audible verification of the operability of the audio input jack.

16. The device of claim 14 wherein the rectifying circuit comprises a bridge rectifying circuit and the AC output signal of the AC power outlet is a 115 volt AC signal which is rectified to a 1.8 volt DC by the rectifying circuit before the AC OK indicator is illuminated.

17. The device of claim 14 wherein the DC output signal of the DC power outlet is a 13.2 volt DC signal which is regulated to a 5 volt DC signal by the DC regulator before the DC OK indicator is illuminated.

18. The device of claim 14 wherein the logic circuit comprises a quad operational amplifier and an AND gate.

19. The device of claim 3 wherein the A/V test circuit further comprises an A/V OK indicator operatively connected to the video input plug such that, when the video plug is connected to a video input jack operatively connected to a continuous video circuit, the A/V OK indicator is illuminated; and the A/V test circuit is operatively connected to the logic circuit and the logic circuit is operable to trigger the system OK indicator when the video plug is operatively connected to a continuous video circuit and the AC plug and the DC plug are inserted in a functioning AC power outlet and a functioning DC power outlet, respectively.

20. The device of claim 3 further comprising a remote control module.

\* \* \* \* \*